United States Patent
Huang et al.

(10) Patent No.: US 10,939,561 B1
(45) Date of Patent: Mar. 2, 2021

(54) WIRING STRUCTURE AND METHOD OF MANUFACTURING THE SAME

(71) Applicant: Advanced Semiconductor Engineering, Inc., Kaohsiung (TW)

(72) Inventors: Wen Hung Huang, Kaohsiung (TW); Min Lung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/552,792

(22) Filed: Aug. 27, 2019

(51) Int. Cl.
  *H05K 1/11* (2006.01)
  *H05K 3/40* (2006.01)
  *H05K 3/42* (2006.01)
  *H05K 3/00* (2006.01)
  *H05K 3/46* (2006.01)

(52) U.S. Cl.
  CPC ............ *H05K 3/429* (2013.01); *H05K 1/116* (2013.01); *H05K 3/0026* (2013.01); *H05K 3/4038* (2013.01); *H05K 3/423* (2013.01); *H05K 3/4682* (2013.01); *H05K 2201/09281* (2013.01); *H05K 2201/09545* (2013.01); *H05K 2203/0723* (2013.01)

(58) Field of Classification Search
  CPC .......... H05K 1/115; H05K 1/11; H05K 1/111; H05K 1/112; H05K 1/113; H05K 1/114; H05K 1/116; H05K 3/4038; H05K 3/4046; H05K 3/4053; H05K 3/4061; H05K 3/4069; H05K 3/4076; H05K 3/4092
  See application file for complete search history.

(56) References Cited

U.S. PATENT DOCUMENTS

| | | | |
|---|---|---|---|
| 2005/0136646 A1* | 6/2005 | Larnerd | H05K 1/115 438/629 |
| 2011/0155439 A1* | 6/2011 | Yamada | H05K 3/4652 174/264 |
| 2014/0182920 A1* | 7/2014 | Yanagisawa | H05K 3/0035 174/266 |

OTHER PUBLICATIONS

U.S. Appl. No. 16/289,072, filed Feb. 28, 2019, Huang et al.

* cited by examiner

*Primary Examiner* — Jeremy C Norris
(74) *Attorney, Agent, or Firm* — Foley & Lardner LLP

(57) ABSTRACT

A wiring structure includes a first dielectric layer, a second dielectric layer adjacent to the first dielectric layer, and a conductive region. The first dielectric layer defines a first opening, and the second dielectric layer defines a second opening. The conductive region includes a conductive via filling the first opening and the second opening. The conductive region further includes a first conductive trace embedded in the second dielectric layer and electrically connected with the conductive via. The conductive region includes a sidewall traversing through a thickness of the second dielectric layer with a substantial linear profile. A method of manufacturing a wiring structure is also disclosed.

21 Claims, 13 Drawing Sheets

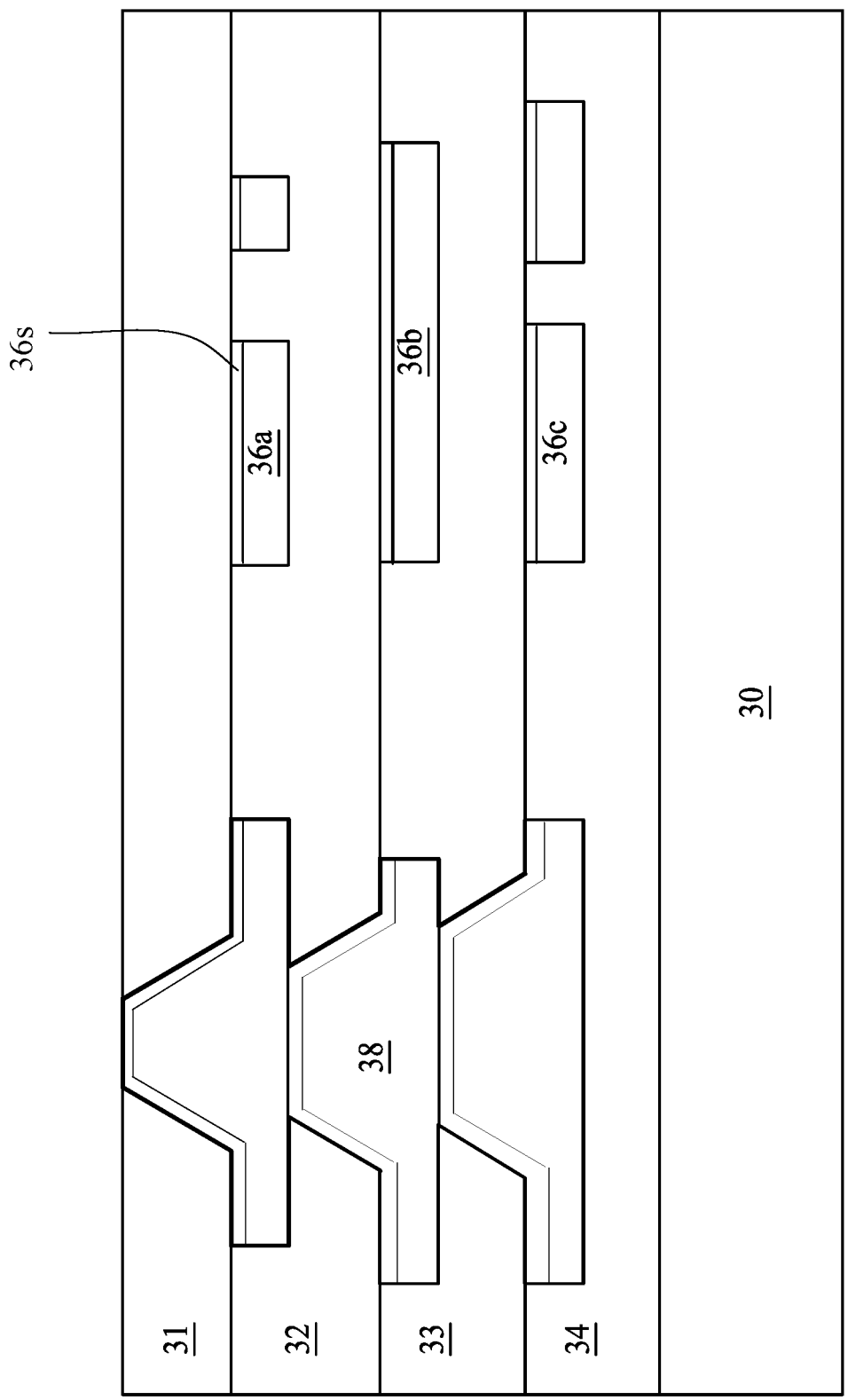

WIRING STRUCTURE AND METHOD OF MANUFACTURING THE SAME

BACKGROUND

1. Technical Field

The present disclosure generally relates to a wiring structure and a method of manufacturing the same, and to a wiring structure having a through via and a method of manufacturing the same.

2. Description of the Related Art

Ultraviolet (UV) laser is used in a manufacturing process of a conductive via for connecting a stack of conductive wiring layers. In a comparative process, each of the stack of conductive wiring layers is designed with a via pad embedded in a dielectric layer. The UV laser is adopted over $CO_2$ laser in order to penetrate through the via pads and the dielectric layers, and forms an opening having a smaller diameter than that of the via pads. However, applying UV laser may generate opening shape anomaly if laser power is not well-controlled, rendering processing difficulties in subsequent electroplating in the opening. Moreover, via pad design in each of the dielectric layers consumes planar area of conductive wiring layer; therefore, such via pad design may not be adopted in advanced product which specifies high density wiring.

SUMMARY

In one or more embodiments, a wiring structure including a first dielectric layer, a second dielectric layer adjacent to the first dielectric layer, and a conductive region. The first dielectric layer defines a first opening, and the second dielectric layer defines a second opening. The conductive region includes a conductive via filling the first opening and the second opening. The conductive region further includes a first conductive trace embedded in the second dielectric layer and electrically connected with the conductive via. The conductive region includes a sidewall traversing through a thickness of the second dielectric layer with a substantial linear profile.

In one or more embodiments, a wiring structure including a substrate, a first dielectric layer on the substrate, a conductive trace embedded in the first dielectric layer, and a conductive via penetrating through the first dielectric layer. The conductive trace penetrates a sidewall of the conductive via, and a seed layer contouring a portion of the conductive trace penetrating the sidewall of the conductive via.

In one or more embodiments, a method of manufacturing a wiring structure includes providing a first dielectric layer and patterning a first conductive trace over the first dielectric layer. The method further includes forming a second dielectric layer over the first conductive trace and forming an opening in the first dielectric layer and the second dielectric layer. The opening overlaps with an end of the first conductive trace thereby exposing a side surface and a top surface of the first conductive trace.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 4A, FIG. 4B, FIG. 4C, FIG. 4D, FIG. 4E, FIG. 4F, FIG. 4G, FIG. 4H, and FIG. 4I illustrate various intermediate stages of a method for manufacturing a wiring structure in a cross sectional perspective, in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
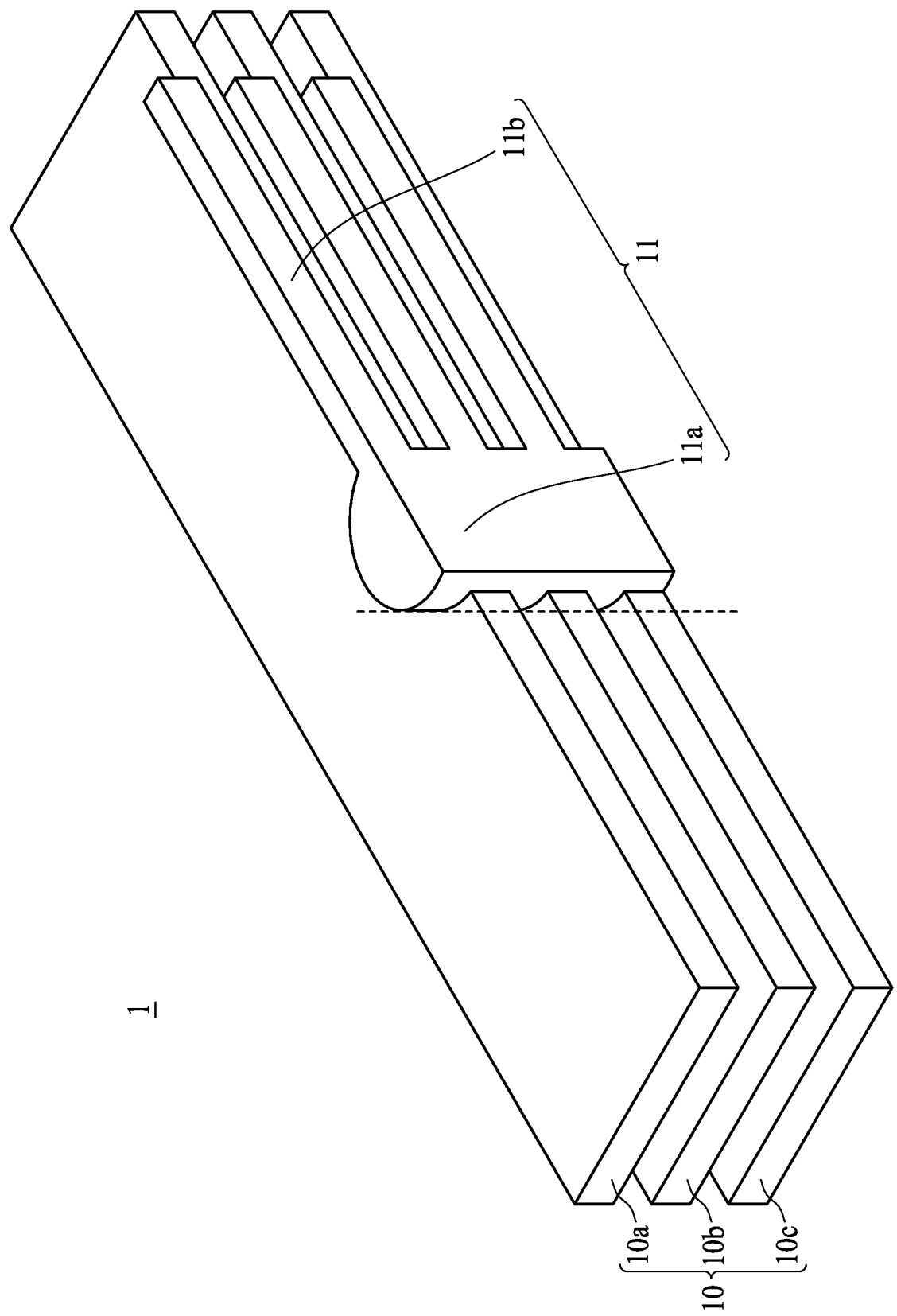
FIG. 1 illustrates a perspective view of a wiring structure in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Present disclosure provides a wiring structure with reduced or no via pad design. $CO_2$ laser may be adopted to form opening in the wiring structure when manufacturing through holes. Opening shape anomaly can be prevented, and the planar area of the wiring structure is preserved as solely a projection area of the through via, instead of a projection area of the via pad or via land.

FIG. 1 illustrates a perspective view of a wiring structure 1 in accordance with some embodiments of the present disclosure. The wiring structure 1 includes a substrate (not shown in FIG. 1), dielectric layers 10a, 10b, and 10c (collectively referred to as the dielectric layer 10), and a conductive region 11 having a conductive via 11a and conductive traces 11b.

The substrate may be, or include, a printed circuit board, such as a paper-based copper foil laminate, a composite copper foil laminate, or a polymer-impregnated glass-fiber-based copper foil laminate. The substrate may be, or include, an organic substrates including organic molecules or polymers, such as pentacene. The substrate may include an interconnection structure, such as a redistribution layer (RDL) or a grounding element.

The dielectric layer 10 is disposed over the substrate. The dielectric layer 10 may include an organic material, a solder mask, a polyimide (PI), an Ajinomoto build-up film (ABF), one or more molding compounds, one or more pre-impregnated composite fibers (e.g., a pre-preg material), a borophosphosilicate glass (BPSG), a silicon oxide, a silicon nitride, a silicon oxynitride, an undoped silicate glass (USG), any combination thereof, or the like. In some embodiments, the thickness of each of the dielectric layers 10a, 10b, and 10c may range from about 6 micrometer (μm) to about 16 μm.

Figure 2:
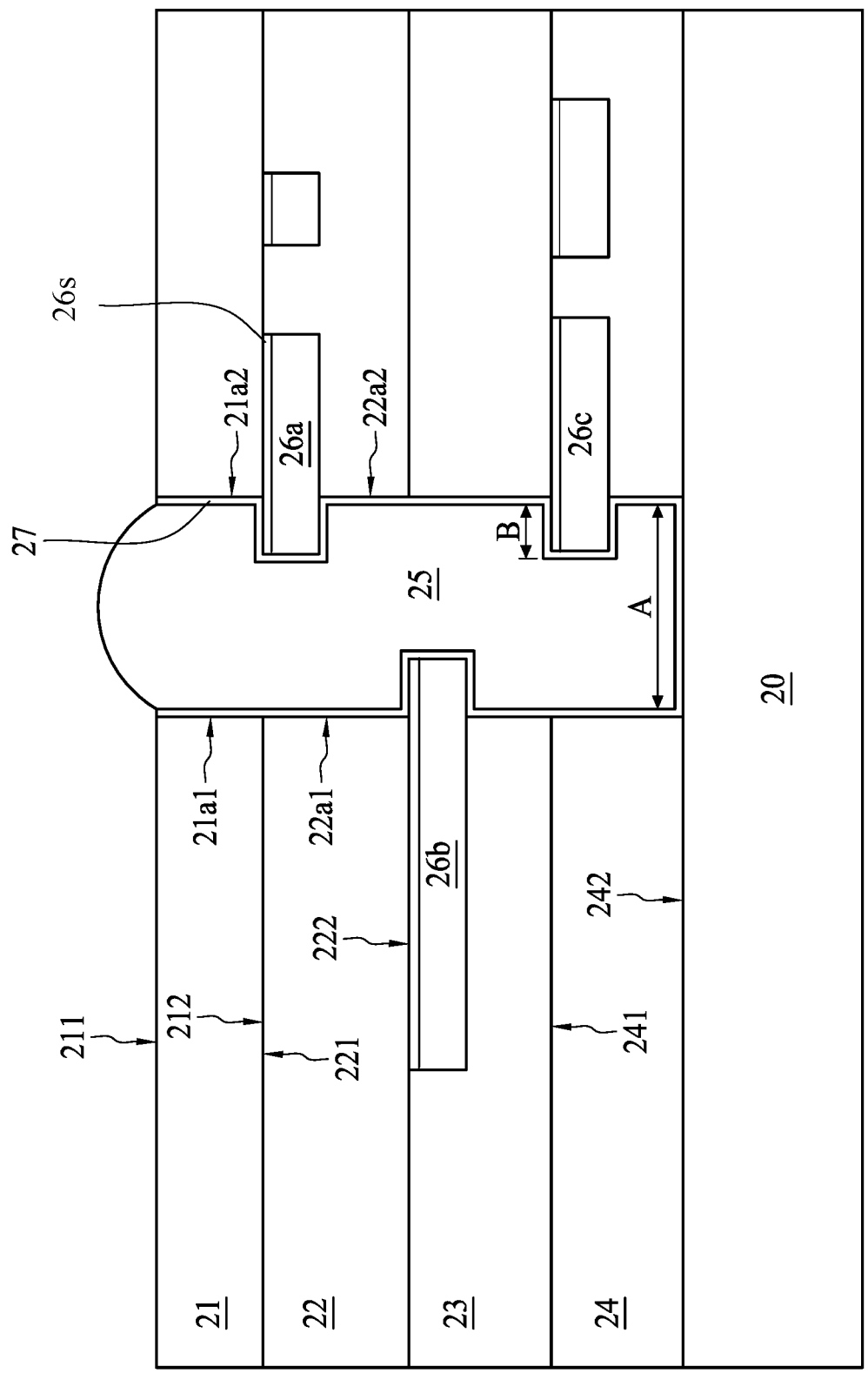
FIG. 2 illustrates a cross sectional view of a wiring structure in accordance with some embodiments of the present disclosure.

The conductive via 11a penetrates through the dielectric layer 10. The conductive traces 11b are embedded (such as shown in FIG. 2) in the dielectric layer 10 and electrically connected with the conductive via 11a. The conductive via 11a and/or conductive traces 11b may include, for example, gold (Au), silver (Ag), copper (Cu), nickel (Ni), palladium (Pd), another metal, a solder alloy, or a combination of two or more thereof.

As shown in FIG. 1, a planar area of the conductive via 11a at the conductive traces 11b layer and a planar area of the conductive via 11a at any of the dielectric layers 10a, 10b, and 10c is substantially identical.

FIG. 2 illustrates a cross sectional view of a wiring structure 2 in accordance with some embodiments of the present disclosure. The wiring structure 2 includes a substrate 20 and dielectric layers 21, 22, 23, and 24. The wiring structure 2 also includes a conductive via 25 and conductive traces 26a, 26b, and 26c. For the materials of the components in the wiring structure 2 (such as the substrate, the dielectric layers, the conductive via, and the conductive traces), please refer to the corresponding components described with respect to FIG. 1.

As shown in FIG. 2, the dielectric layers 21, 22, 23, and 24 are stacked on the substrate 20. The dielectric layer 24 has a surface 242 in contact with the substrate 20 and a surface 241 opposite to the surface 242 and in contact with the dielectric layer 23. The dielectric layer 22 has a surface 222 in contact with the dielectric layer 23 and a surface 221 opposite to the surface 222 and in contact with the dielectric layer 21. The dielectric layer 21 has a surface 212 in contact with the dielectric layer 22 and a surface 211 opposite to the surface 212.

The conductive via 25 penetrates through the dielectric layers 21, 22, 23, and 24 and has an end connected to the substrate 20. For examples, the conductive via 25 has a sidewall 21a1 in contact with the dielectric layer 21 and a sidewall 22a1 in contact with the dielectric layer 22. The sidewall 21a1 traverses through the thickness of the dielectric layer 21 in a stacking direction of the dielectric layers 21, 22, 23, and 24. The sidewall 22a1 traverses through the thickness of the dielectric layer 22 in the stacking direction. In some embodiments, the sidewall 21a1 and the sidewall 22a1 are coplanar. For examples, the sidewall 21a1 and the sidewall 22a1 form a continuous surface without differential steps. In some embodiments, both the sidewall 21a1 and the sidewall 22a1 have substantially linear profiles. For examples, the sidewall 21a1 and the sidewall 22a1 are smoothly connected. For examples, the sidewall 21a1 and/or the sidewall 22a1 has a substantially linear profile substantially perpendicular to at least one of the surfaces 211, 212, 221, and 222. For examples, the sidewall 21a1 and/or the sidewall 22a1 has a substantially linear profile substantially inclined with respect to at least one of the surfaces 211, 212, 221, and 222.

The conductive traces 26a, 26b, and 26c are embedded in the dielectric layers 21, 22, 23, and 24. The conductive traces 26a, 26b, and 26c are electrically connected with the conductive via 25.

As shown in FIG. 2, the conductive trace 26a is embedded in the dielectric layer 22 and adjacent to the surface 212 of the dielectric layer 21. The conductive trace 26b is embedded in the dielectric layer 23 and adjacent to the surface 222 of the dielectric layer 22. The conductive trace 26c is embedded in the dielectric layer 24 and adjacent to the dielectric layer 23.

The conductive trace 26a has a seed layer 26s adjacent to the surface 212 of the dielectric layer 21. The conductive trace 26b has a seed layer adjacent to the surface 222 of the dielectric layer 22. The conductive trace 26c has a seed layer adjacent to the surface 241 of the dielectric layer 24. In some embodiments, the seed layer 26s (and the other seed layers of the conductive traces) may include, for example, titanium (Ti), Cu, Ni, another metal, or alloy (such as a titanium-tungsten alloy (TiW)). In some embodiments, the seed layer 26s (and the other seed layers of the conductive traces) may include multiple layers, such as a layer of Cu and a layer of Ti, a layer of Cu and a layer of TiW. In some embodiments, the layer of Ti and/or the layer of TiW may help to enhance the adhesion between the dielectric layers and the conductive traces. In some embodiments, the layer of Ti and/or the layer of TiW may help to prevent Cu out-diffusion.

From a cross sectional view, the conductive traces 26a, 26b, and 26c penetrate through the sidewalls of the conductive via 25 from different directions. For examples, the conductive trace 26a penetrates through a sidewall 22a2 of the conductive via 25 from a first side, and the conductive trace 26b penetrates through a sidewall of the conductive via 25 in contact with the dielectric layer 23 from a second side opposite to the first side. In some embodiments, the conductive trace 26b may not penetrate through the sidewall of the conductive via 25 from the second side opposite to the first side but from a third side forming a 60 degrees angle with the first side.

The sidewall 22a2 of the conductive via 25 is opposite to the sidewall 22a1 of the conductive via 25, and traverses through the dielectric layer 22 in a thickness or stacking direction. The sidewall 22a2 of the conductive via 25 is penetrated by the conductive trace 26a. For examples, a portion is recessed from the sidewall 22a2 of the conductive via 25 for accommodating the conductive trace 26a. A boundary between the conductive trace 26a and the conductive via 25 can be observed since a seed layer 27 is formed at the boundary with differentiable microstructures.

In some embodiments, the dielectric layers 22, 23, and/or 24 may include a sidewall having a substantially linear profile and a sidewall on another side embedding and surrounding the conductive traces 26a, 26b, and 26c. For examples, the dielectric layer 22 has a sidewall (in contact with the sidewall 22a1 of the conductive via 25) having a substantially linear profile and a sidewall on another side (in contact with the sidewall 22a2 of the conductive via 25) embedding and surrounding the conductive trace 26a.

In some embodiments, the penetrating depth (annotated as "B") of the conductive traces 26a, 26b, and/or 26c may be less than half of a width (annotated as "A") of the conductive via 25. In some embodiments, the width A of the conductive via 25 is 100 μm or less, 80 μm or less, or 60 μm or less. In some embodiments, the penetrating depth B of the conductive traces 26a, 26b, and/or 26c may be less than 50 µm or less, 40 µm or less, or 30 µm or less.

In some comparative embodiments, the conductive trace may be formed to have a via pad or via land at one end, and an opening for accommodating the conductive via is formed inside the area of the via pad or via land. In other words, the projected area of the opening (and the projected area of the conductive via formed thereafter) is within the projected area of the pad. Since a portion of the pad has to be removed, the opening may be formed by conducting an Ultraviolet (UV) laser drill. The UV laser drill should be conducted precisely by adjusting the energy thereof, otherwise voids may be formed in the following electroplating and/or electroless plating operations in the opening.

By designing the penetrating depth to be less than half of a width of the conductive via (or the width of the opening) and eliminating the pad, the opening may be formed in the dielectric layer by conducting a carbon dioxide ($CO_2$) laser drilling. $CO_2$ laser drilling can remove the dielectric layers without affecting the conductive traces. In other words, as shown in FIG. 2, the conductive traces 26a, 26b, and 26c may remain substantially intact after the $CO_2$ laser drilling is conducted to form an opening accommodating the conductive via 25. The $CO_2$ laser drilling is easier to be controlled (compared with the UV laser drill) and the cost is lower than the UV laser drill. Therefore, the void in the conductive via 25 can be avoided. In addition, since the pad is eliminated, there are more spaces for arranging electrical contacts in the wiring structure 2.

Still referring to FIG. 2, a seed layer 27 is disposed on the sidewalls (such as the sidewalls 21a1, 21a2, 22a1, and 22a2) of the conductive via 25. The seed layer 27 is also disposed on the bottom surface of the conductive via 25 constituted of the substrate 20. The seed layer 27 is also disposed on some portions of each of the conductive traces 26a, 26b, and 26c that penetrating into the conductive via 25. The seed layer 27 contours the sidewalls and the bottom surface of the conductive via 25. The seed layer 27 also contours some portions of each of the conductive traces 26a, 26b, and 26c that penetrate into the conductive via 25. For examples, the seed layer 27 bounds the shape of some portions of each of the conductive traces 26a, 26b, and 26c that penetrate into the conductive via 25.

The seed layer 27 is disposed on the interfaces between the conductive via 25 and each of the conductive traces 26a, 26b, and 26c. The seed layer 27 is in contact with the seed layer 26s of the conductive trace 26a and other seed layers corresponding to respective conductive traces 26b, 26c. The seed layer 27 is in contact and electrically connected with the conductive via 25 and each of the conductive traces 26a, 26b, and 26c. The seed layer 27 is between the conductive via 25 and each of the conductive traces 26a, 26b, and 26c.

In some embodiments, the seed layer 27 may include, for example, Ti, Cu, Ni, another metal, or alloy (such as TiW). In some embodiments, the microstructure of the seed layer 27 is different from the microstructure of the conductive via 25 and/or the microstructure of the conductive traces 26a, 26b, and 26c. For examples, the crystal structures, the grain sizes, or the other microstructures thereof can differentiate between of the seed layer 27 and the conductive via. 25. For examples, the crystal structures, the grain sizes, or the other microstructures thereof can differentiate between of the seed layer 27 and the conductive traces 26a, 26b, and 26c.

In some embodiments, the conductive via 25 is protruded from the surface 211 of the dielectric layer 21. For examples, a top surface of the conductive via 25 is a curved surface protruding from the surface 211 of the dielectric layer 21. In some embodiments, a top surface of the conductive via 25 is substantially coplanar with the surface 211 of the dielectric layer 21.

Figure 3A:
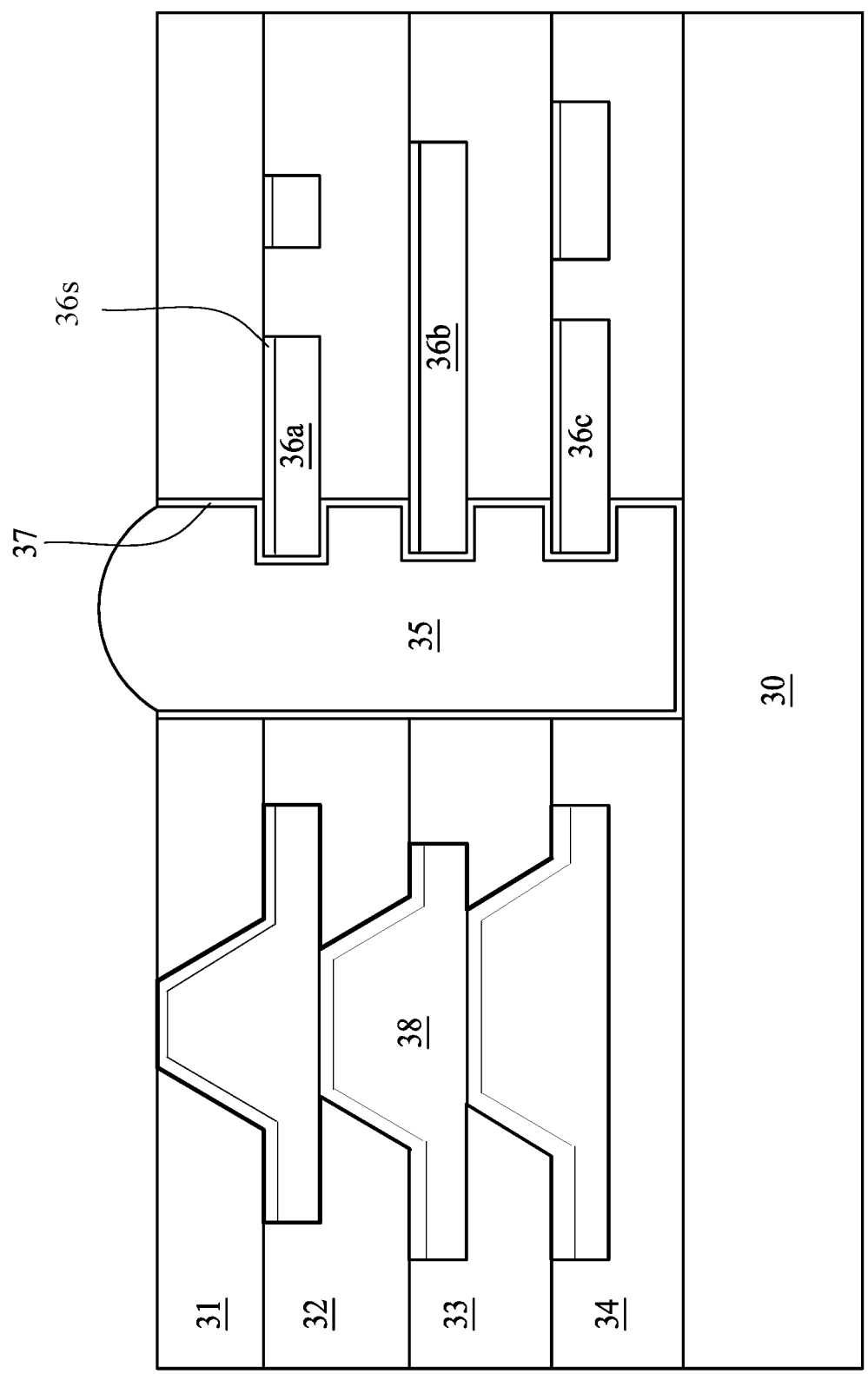
FIG. 3A illustrates a cross sectional view of a wiring structure in accordance with some embodiments of the present disclosure.

FIG. 3A illustrates a side view of a wiring structure 3 in accordance with some embodiments of the present disclosure. The wiring structure 3 includes a substrate 30 and dielectric layers 31, 32, 33, and 34. The wiring structure 3 also includes a conductive via 35 and conductive traces 36a, 36b, and 36c. The wiring structure 3 also includes a conductive structure 38. The wiring structure 3 in FIG. 3A is similar to the wiring structure 2 in FIG. 2 except for the differences described below.

The conductive structure 38 is disposed above the substrate 30 and is surrounded by the dielectric layers 31, 32, 33, and 34. The conductive structure 38 is spaced apart from the substrate 30. The conductive structure 38 is disposed adjacent to the conductive via 35. In some embodiments, the conductive structure 38 may be a fan-out wiring layers.

The conductive structure 38 may include a material as described above for the conductive via and the conductive traces in FIG. 1. In some embodiments, the conductive structure 38 and the conductive traces 36a, 36b, and 36c may be formed in the same operations.

Figure 3B:
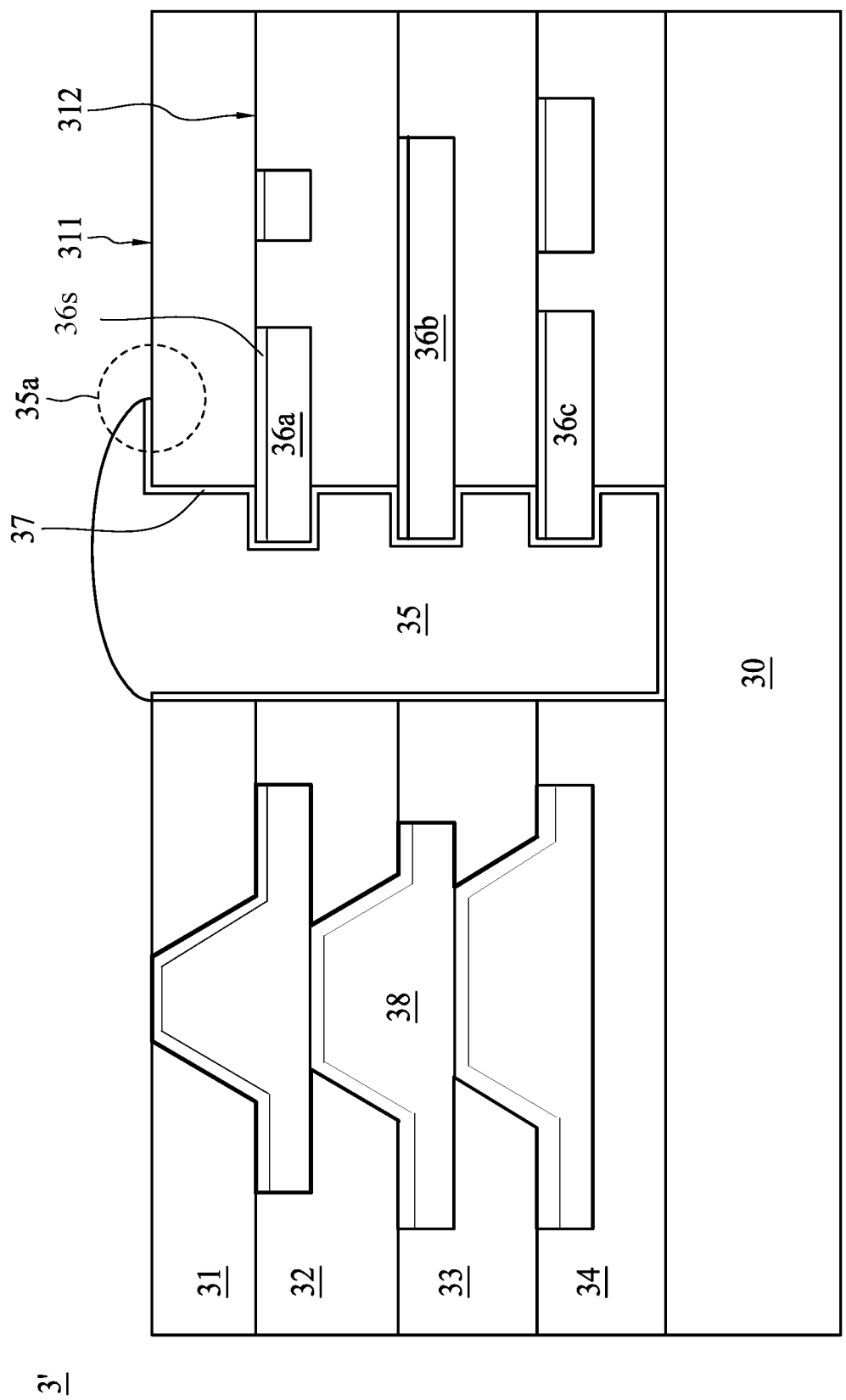
FIG. 3B illustrates a cross sectional view of a wiring structure in accordance with some embodiments of the present disclosure.

FIG. 3B illustrates a side view of a wiring structure 3' in accordance with some embodiments of the present disclosure. The wiring structure 3' in FIG. 3B is similar to the wiring structure 3 in FIG. 3A except for the differences described below.

The conductive via 35 in the wiring structure 3' has an edge portion 35a overflowing on a surface 311 of the dielectric layer 31 facing away from the substrate 30. The seed layer 37 is disposed on the surface 311, and the edge portion 35a of the conductive via 35 is disposed on the seed layer 37 on the surface 311. The seed layer 37 on the surface 311 is between the edge 35a and the dielectric layer 31.

FIG. 4A, FIG. 4B, FIG. 4C, FIG. 4D, FIG. 4E, FIG. 4F, FIG. 4G, FIG. 4H, and FIG. 4I are cross-sectional views of a wiring structure at various stages of fabrication, in accordance with some embodiments of the present disclosure. At least some of these figures have been simplified for a better understanding of the aspects of the present disclosure.

Figure 4A:
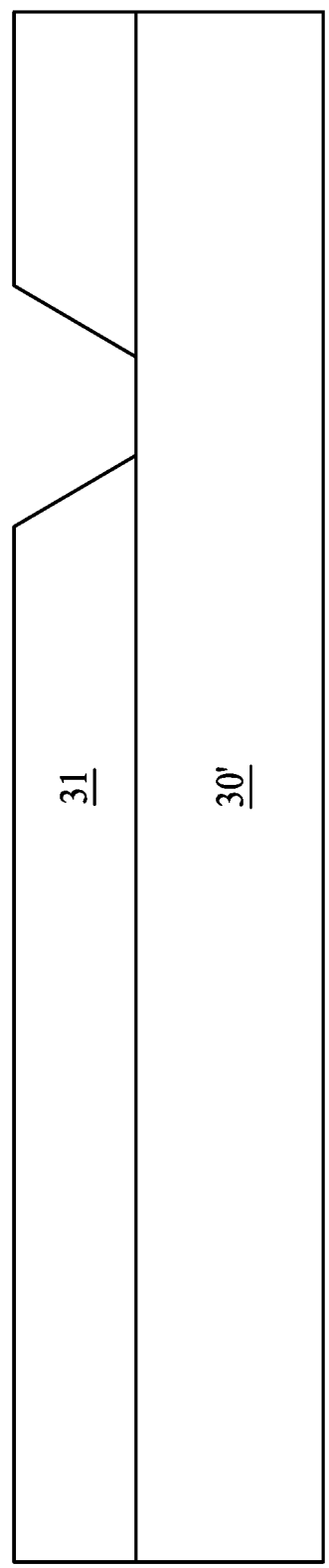

Referring to FIG. 4A, a dielectric layer 31 is disposed on a temporary substrate 30'. In some embodiments, the dielectric layer 31 may be formed by, for example, coating, lamination or other suitable processes. Then, a photoresist film (or a mask) is formed on the dielectric layer 31, and the dielectric layer 31 is patterned through the mask to form a cavity and expose a portion of the temporary substrate 30'. In some embodiments, the cavity in the dielectric layer has an inclined sidewall with respect to the surface of the temporary substrate 30'.

Figure 4B:
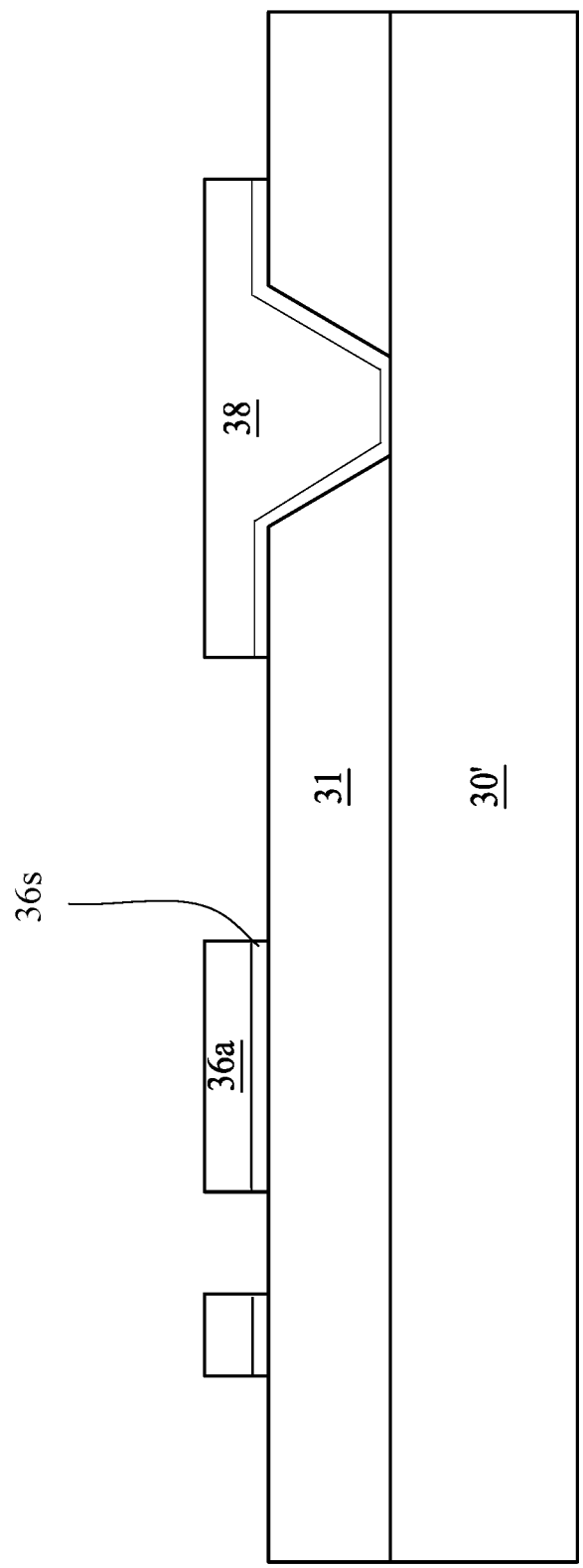

Referring to FIG. 4B, a conductive material is disposed on the dielectric layer 31 and the exposed surface of the temporary substrate 30 temporary substrate 30'. In some embodiments, the conductive material may be formed by plating Cu, Ag, Ni, Au, or another metal. In some embodiments, the conductive material may be formed by electroless plating Cu, Ni, Pb, or another metal. In some embodiments, the conductive material may be formed by printing Cu, Ag, Au, or another metal. The conductive material is patterned to form a conductive trace 36a. For examples, a photoresist film (or a mask) is formed on the conductive material by, for example, coating. One or more openings are formed in the photoresist film by, for example, lithographic technique, to expose a portion of the conductive material. The conductive material is patterned through the openings in the photoresist film. In some embodiments, before the conductive material is formed, titanium and copper (Ti/Cu) or a TiW is sputtered on the dielectric layer 31 and the exposed surface of the temporary substrate 30 temporary substrate 30' to serve as a seed layer. The seed layer and the conductive material are patterned to form a seed layer 36a1 and a conductive trace 36a.

Figure 4C:
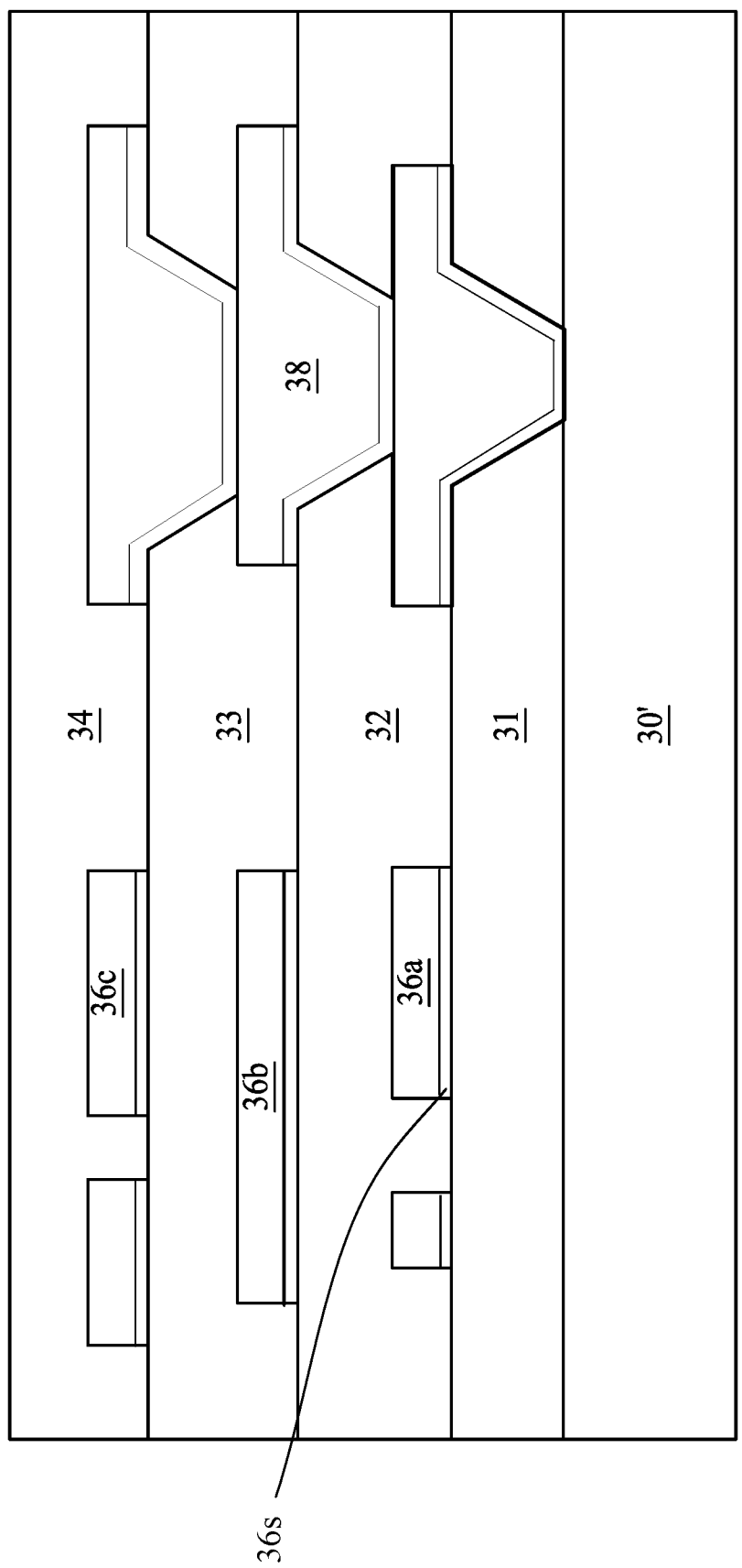

The operations described above for the formation of the dielectric layer 31 and the conductive trace 36a may be repeatedly performed two or more times to form multi-layers of dielectric layers and the conductive traces, and the resulting structure is shown in FIG. 4C. For examples, the structure in FIG. 4C includes dielectric layers 31, 32, 33, and 34, conductive traces 36a, 36b, and 36c. The conductive traces 36a, 36b, and 36c are formed to be at least partially overlapped with each other.

In some embodiments, as shown in FIG. 4B, a portion of conductive structure 38 is formed at the same operation as the conductive trace 36a. The conductive structure 38 is constituted by forming an opening in a dielectric layer (such as forming an opening in the dielectric layer 32), disposing a conductive material in the opening and on conductive material previously disposed in the dielectric layer 31. In other words, the conductive structure 38 shown in FIG. 4C is formed in a layer-by-layer manner connecting with each other. On the other hands, the conductive traces 36a, 36b, and 36c are spaced apart from each other by the dielectric layers 32 and 33. By the time the completion of the conductive structure 38 in the intermediate wiring structure of FIG. 4C, electrical connection connecting the conductive traces 36a, 36b, and 36c in different dielectric layers 32, 33, 34 may not have been formed.

Figure 4D:
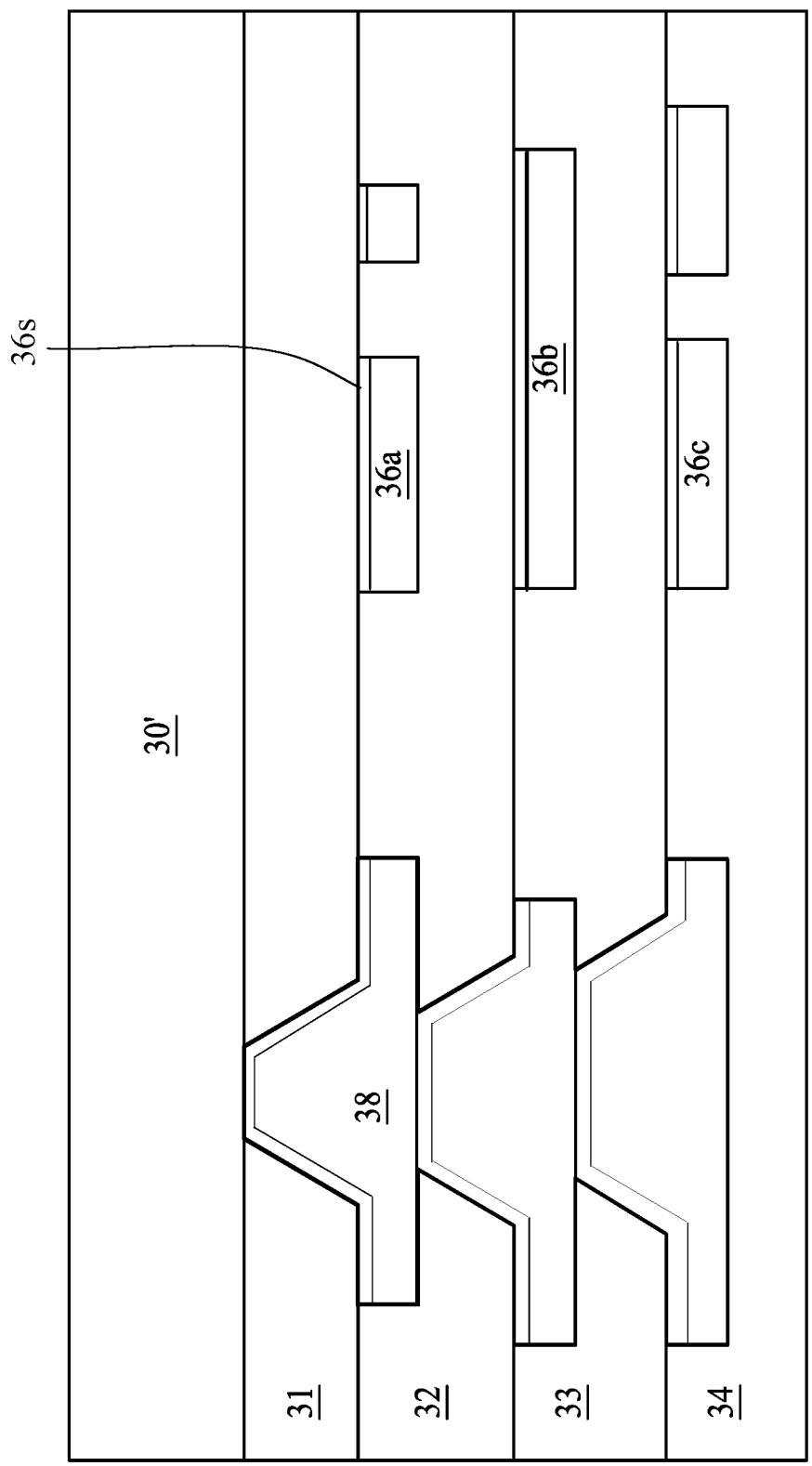
Figure 4E:
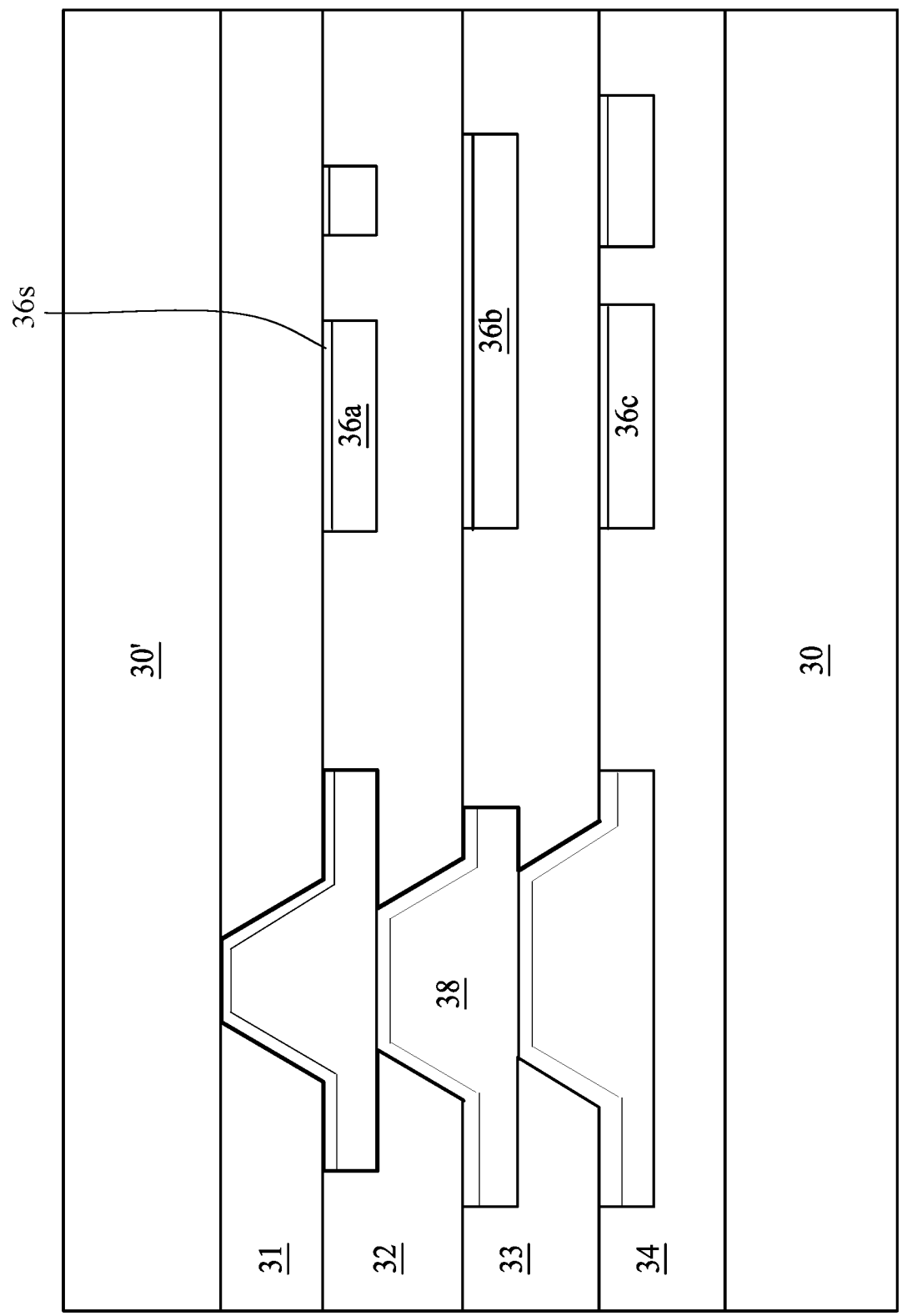

Referring to FIG. 4D, the structure obtained through FIG. 4A to FIG. 4C is reversed upside down and ready for carrier transfer. Referring to FIG. 4E, a substrate 30, for example, a permanent substrate, is provided to support the wiring structure from the dielectric layer 34 originally most distant from the temporary substrate 30'. Referring to FIG. 4F, the temporary substrate 30' is removed to expose a surface of the dielectric layer 31 originally most proximal to the temporary substrate 30'.

Figure 4G:
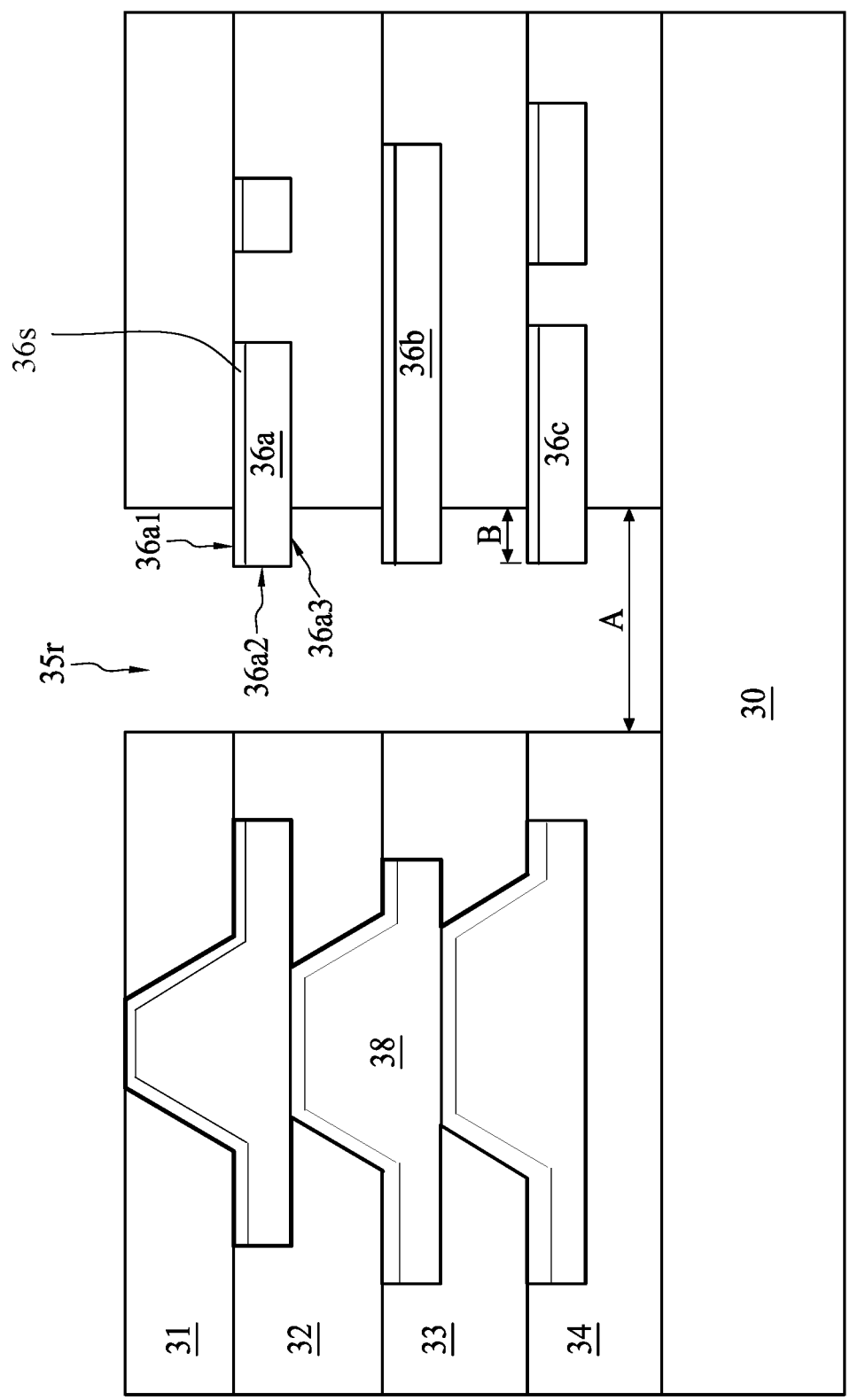

Referring to FIG. 4G, an opening 35r is formed to penetrate the dielectric layers 31, 32, 33, and 34. In some embodiments, the opening 35r is formed by performing a laser drilling, such as the $CO_2$ laser drilling. The $CO_2$ laser drilling removes some portions of the dielectric layers 31, 32, 33, and 34 and leaving the conductive traces 36a, 36b, and 36c, as well as the corresponding seed layers, for example, the seed layer 36a1 of the conductive trace 36a, intact. A projection area of the opening 35r overlaps with an end of the conductive trace 36a, an end of the conductive trace 36b, and an end of the conductive trace 36c facing the opening 35r. In some embodiments, after the opening is formed, a top surface 36a1, a side surface 36a2, and a bottom surface 36a3 of the conductive trace 36a is exposed from the dielectric layer 32. In some embodiments, the exposed portion of the conductive traces 36a, 36b, and 36c may have a penetrating depth B less than half of a width A of the opening 35r. In some embodiments, prior to the $CO_2$ laser drilling operation, the portion of the conductive traces 36a, 36b, and 36c extending into a projection area of the to-be-formed opening serve as a negligible obstruction to the $CO_2$ laser drilling process. Since the dimension of the portion of the conductive traces 36a, 36b, and 36c extending into a projection area of the to-be-formed opening occupies a small portion of the planar area of the to-be-formed opening, the opening 35r can be formed under the shading of the conductive traces 36a, 36b, and 36c. The operation parameters of the $CO_2$ laser drilling can be adjusted to obtain a substantially vertical sidewall in the dielectric layers 31, 32, 33, 34. The operation parameters of the $CO_2$ laser drilling can be adjusted to obtain an inclined sidewall in the dielectric layers 31, 32, 33, 34, for example, with greater opening width at the end proximal to the dielectric layer 31 and narrower opening width at the end proximal to the dielectric layer 34.

As shown in FIG. 4G, a projection area of the conductive via is determined by the dimension of the opening 35r rather than a projection area of the via land or via pad previously discussed in the comparative embodiments. In this connection, via design in the present embodiments preserves more planar die area for additional wiring or routing or simply reduce the die size.

Figure 4H:
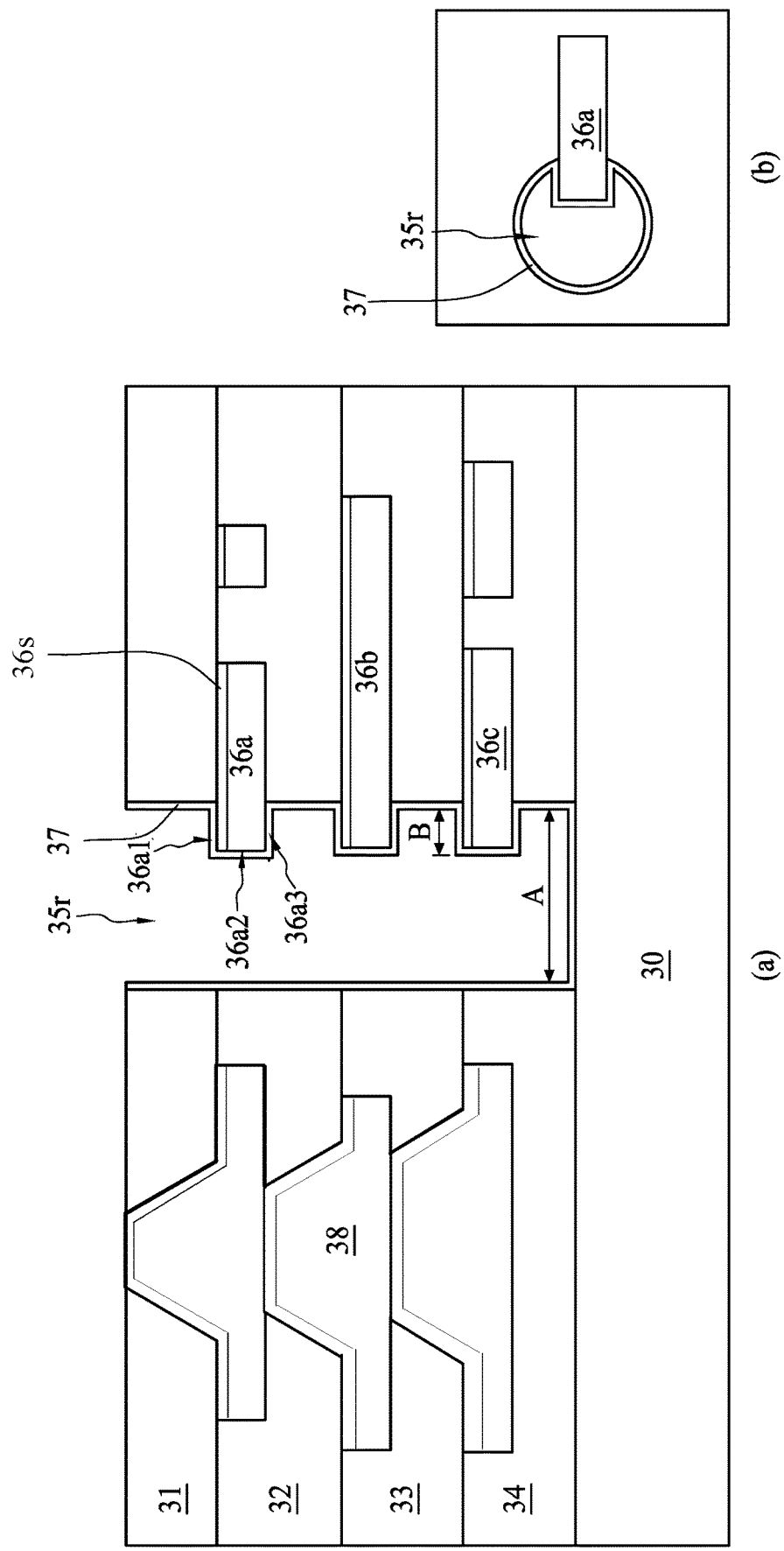

Referring to FIG. 4H, FIG. 4H shows a cross section denoted as (a) and a top view, denoted as (b), of the corresponding cross section. In (a) of FIG. 4H, a seed layer 37 is disposed over the top surface 36a1, the side surface 36a2 and the bottom surface 36a3 of the conductive trace 36a. The seed layer 37 may be in contact with the seed layer 36a1 of the conductive trace 36a. The seed layer 37 is also disposed on the exposed surface of the conductive traces 36b and 36c. The seed layer 37 is also disposed on the exposed surface of the substrate 30 and the sidewalls of the opening 35r. In some embodiments, the seed layer 37 may be formed by sputtering titanium and copper (Ti/Cu) or a titanium-tungsten alloy (TiW). In some embodiments, the seed layer 37 may be formed by electroless plating Ni or Cu.

In (b) of FIG. 4H, a top view of the opening 35r, the conductive trace 36a, and the seed layer 37 are illustrated correspondingly. The conductive trace 36a penetrates the sidewall of the opening 35r by a penetrating depth B less than half of the width A of the opening 35r. After the formation of the seed layer 37, the sidewall and the bottom of the opening 35r are covered by the seed layer 37.

In some embodiments, referring to FIG. 3B and FIG. 4H, formation of the seed layer 37 can also cover a portion of the dielectric layer 31 from the surface 311, thereby causing the subsequent electroplating of the conductive via 35 to cover a portion of the surface 311 of the dielectric layer 31. In some embodiments, such conductive via coverage may be removed in subsequent planarization operation in the packaging process.

Figure 4I:
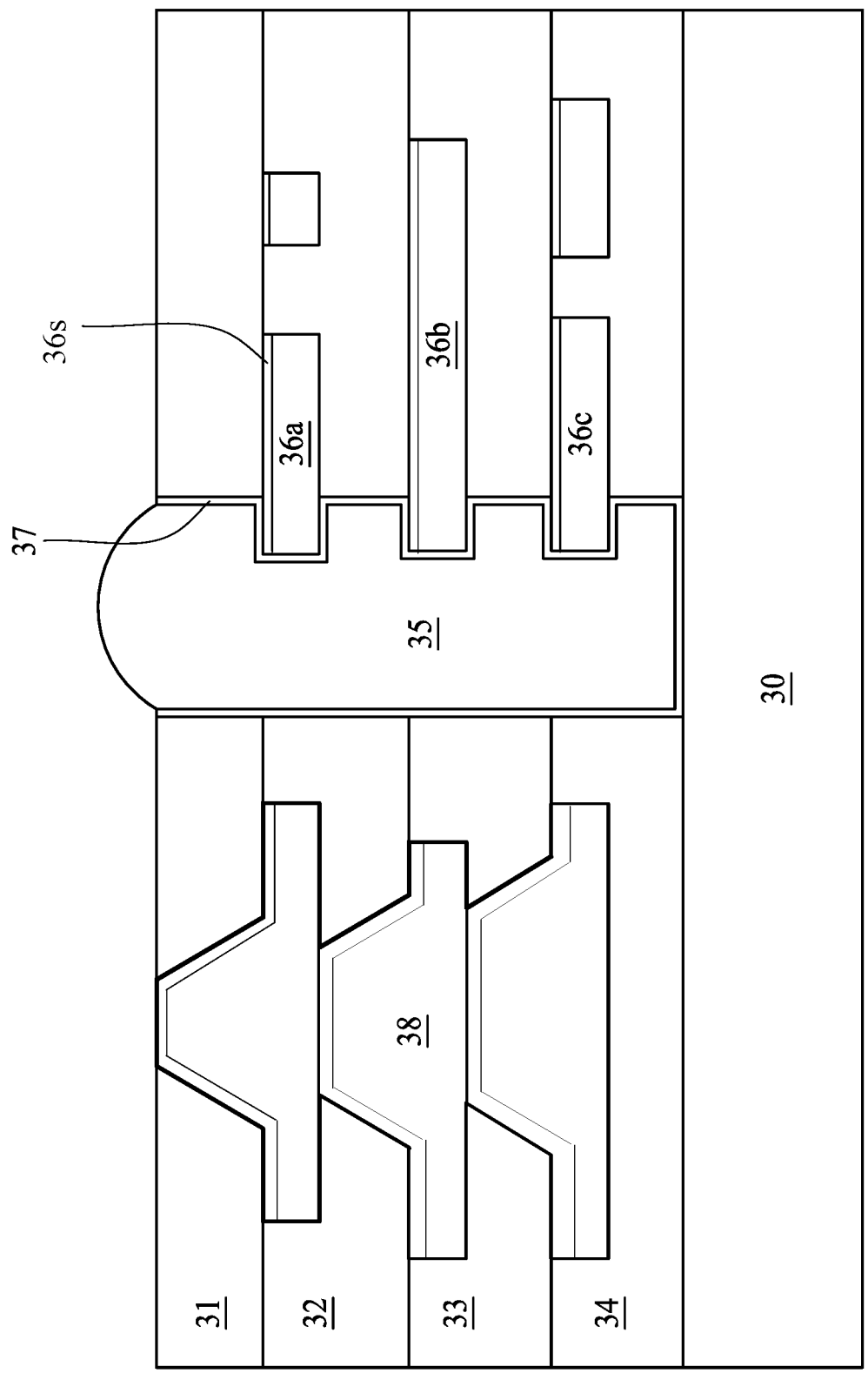

Referring to FIG. 4I, a conductive via 35 is formed in the opening 35r and on the seed layer 37. In some embodiments, the conductive via 35 is formed through an electroplating operation. For examples, the conductive via 35 may be formed by plating Cu, Ag, Ni, Au, or another metal. In some embodiments, the conductive via 35 may be formed by electroless plating Cu, Ni, Pb, or another metal. In some embodiments, the conductive via 35 may be formed by printing Cu, Ag, Au, or another metal.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (µm) of lying along the same plane, such as within 10 µm, within 5 µm, within 1 µm, or within 0.5 µm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A wiring structure, comprising:
    a first dielectric layer defining a first opening;
    a second dielectric layer adjacent to the first dielectric layer, the second dielectric layer defining a second opening; and
    a conductive region, comprising:
        a conductive via filling the first opening and the second opening; and
        a first conductive trace embedded in the second dielectric layer and electrically connected with the conductive via;
    wherein the conductive region comprises a sidewall traversing through an entire thickness of the second dielectric layer with a substantial linear profile;
    wherein a penetrating depth of the first conductive trace is less than half of a width of the conductive via.

2. The wiring structure of claim 1, wherein the first dielectric layer has a first surface and a second surface, the second dielectric layer has a first surface and a second surface, the second surface of the first dielectric layer is in contact with the first surface of the second dielectric layer.

3. The wiring structure of claim 2, wherein the sidewall is vertical with respect to the first surface of the second dielectric layer.

4. The wiring structure of claim 2, wherein the sidewall is inclined with respect to the first surface of the second dielectric layer.

5. The wiring structure of claim 2, wherein the first conductive trace is disposed adjacent to the first surface of the second dielectric layer.

6. The wiring structure of claim 1, wherein the sidewall of the conductive region further traverses through an entire thickness of the first dielectric layer with a substantial linear profile.

7. The wiring structure of claim 6, wherein the sidewall of the conductive region transverse through the entire thickness of the first dielectric layer and the entire thickness of the second dielectric layer.

8. The wiring structure of claim 1, further comprising:
    a seed layer contouring a portion of the first conductive trace.

9. The wiring structure of claim 8, wherein the seed layer further contouring a bottom surface of the conductive via.

10. A wiring structure, comprising:
    a substrate;
    a first dielectric layer on the substrate;
    a second dielectric layer on the first dielectric layer;
    a conductive trace embedded in the first dielectric layer; and
    a conductive via penetrating through the first dielectric layer and the second dielectric layer,
    wherein the conductive trace penetrates a sidewall of the conductive via, and a seed layer contouring a portion of the conductive trace penetrating the sidewall of the conductive via;
    wherein a penetrating depth of the conductive trace is less than half of a width of the conductive via.

11. The wiring structure of claim 10, wherein the first dielectric layer has a first surface and a second surface, the second surface of the first dielectric layer is in contact with the substrate; and the conductive trace is adjacent to the first surface of the first dielectric layer.

12. The wiring structure of claim 10, wherein a grain size of the seed layer is different from that of the conductive via.

13. The wiring structure of claim 10, wherein a grain size of the seed layer is different from that of the conductive trace.

14. The wiring structure of claim 10, wherein the seed layer is further disposed on an interface between the first dielectric layer and the conductive via.

15. The wiring structure of claim 10, wherein the second dielectric layer having a top surface facing away from the substrate, the seed layer being further disposed on the top surface of the second dielectric layer.

16. A method of manufacturing a wiring structure, comprising:
    providing a first dielectric layer;
    patterning a first conductive trace over the first dielectric layer;
    forming a second dielectric layer over the first conductive trace; and
    forming an opening in the first dielectric layer and the second dielectric layer by removing materials of the first dielectric layer and the second dielectric layer only from a surface of the first dielectric layer, the opening overlapping with an end of the first conductive trace thereby exposing a side surface and a top surface of the first conductive trace;
    wherein forming the opening further exposes a bottom surface of the first conductive trace.

17. The method of claim 16, further comprising:
    providing the first dielectric layer on a temporary substrate; and
    removing the temporary substrate to expose a surface of the first dielectric layer prior to forming the opening.

18. The method of claim 17, further comprising:
attaching the first dielectric layer, the first conductive trace, and the second dielectric layer to a permanent substrate prior to forming the opening.

19. The method of claim 16, further comprising:
forming a seed layer on the side surface and the top surface of the first conductive trace after forming the opening.

20. The method of claim 16, further comprising:
forming a conductive via in the opening through an electroplating operation.

21. The method of claim 16, wherein forming the opening comprises performing a carbon dioxide laser drilling.

\* \* \* \* \*